United States Patent
Wu et al.

(10) Patent No.: US 10,297,733 B2
(45) Date of Patent: May 21, 2019

(54) HIGH-VOLTAGE LIGHT EMITTING DIODE CHIP AND FABRICATION METHOD

(71) Applicant: XIAMEN SANAN OPTOELECTRONICS TECHNOLOGY CO., LTD., Xiamen (CN)

(72) Inventors: Hou-jun Wu, Xiamen (CN); Jiansen Zheng, Xiamen (CN); Chen-ke Hsu, Xiamen (CN); Anhe He, Xiamen (CN); Chia-en Lee, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 112 days.

(21) Appl. No.: 15/390,951

(22) Filed: Dec. 27, 2016

(65) Prior Publication Data
US 2017/0110638 A1    Apr. 20, 2017

Related U.S. Application Data

(63) Continuation of application No. PCT/CN2015/073464, filed on Mar. 2, 2015.

(30) Foreign Application Priority Data

Jul. 25, 2014   (CN) .......................... 2014 1 0358143

(51) Int. Cl.
*H01L 33/62*  (2010.01)
*H01L 27/15*  (2006.01)
(Continued)

(52) U.S. Cl.
CPC ............ *H01L 33/62* (2013.01); *H01L 27/153* (2013.01); *H01L 27/156* (2013.01); *H01L 33/22* (2013.01);
(Continued)

(58) Field of Classification Search
None
See application file for complete search history.

(56) References Cited

U.S. PATENT DOCUMENTS

2007/0284598 A1*  12/2007  Shakuda ............... H01L 27/156
                                                              257/93
2009/0134413 A1*  5/2009  Roth ..................... C09K 11/663
                                                              257/98

(Continued)

*Primary Examiner* — Eduardo A Rodela
*Assistant Examiner* — Nilufa Rahim
(74) *Attorney, Agent, or Firm* — Syncoda LLC; Feng Ma

(57) ABSTRACT

A high-voltage light emitting diode and fabrication method thereof, in which, the liquid insulating material layer/the liquid conducting material layer, after curing, is used for insulating/connecting, making the isolated groove between the light emitting units extremely narrow (opening width ≤0.4 μm, such as ≤0.3 μm), which improves single chip output, expands effective light emitting region area and improves light emitting efficiency; the serial/parallel connection yield is improved for this method avoids easy disconnection of wires across a groove with extremely large height difference in conventional high-voltage light emitting diodes; in addition, the manufacturing cost is reduced for the LED can be directly fabricated at the chip fabrication end.

17 Claims, 5 Drawing Sheets

(51) Int. Cl.
*H01L 33/22* (2010.01)
*H01L 33/42* (2010.01)

(52) U.S. Cl.
CPC ............. *H01L 33/42* (2013.01); *H01L 27/15* (2013.01); *H01L 2933/0016* (2013.01); *H01L 2933/0066* (2013.01)

(56) References Cited

U.S. PATENT DOCUMENTS

| | | | | |
|---|---|---|---|---|
| 2009/0140272 | A1* | 6/2009 | Beeson | H01L 33/42 257/89 |
| 2010/0025673 | A1* | 2/2010 | Hu | H01L 33/06 257/43 |
| 2011/0229737 | A1* | 9/2011 | Yukinobu | C23C 18/1216 428/702 |
| 2012/0061694 | A1* | 3/2012 | Shen | H01L 25/0753 257/88 |
| 2013/0032815 | A1* | 2/2013 | Hung | H01L 27/156 257/76 |
| 2015/0325621 | A1* | 11/2015 | Kim | H01L 27/153 257/93 |

* cited by examiner

HIGH-VOLTAGE LIGHT EMITTING DIODE CHIP AND FABRICATION METHOD

CROSS-REFERENCE TO RELATED APPLICATIONS

The present application is a continuation of, and claims priority to, PCT/CN2015/073464 filed on Mar. 2, 2015, which claims priority to Chinese Patent Application No. 201410358143.X filed on Jul. 25, 2014. The disclosures of these applications are hereby incorporated by reference in their entirety.

BACKGROUND

A light emitting diode (LED) is a type of semiconductor diode. It can convert electric energy into the luminous energy and emit visible light in yellow, green, blue, and the like, as well as invisible infrared and ultraviolet light.

In recent years, high-power LEDs have become a key development concern by factories to meet lighting demands. In conventional high-power normal-chip LEDs, in general, the light emitting unit is a single chip featured with high current and low voltage, and the light emitting efficiency is affected by the raising junction temperature when big current is injected to the chip. In recent years, integrated high-voltage LEDs consisting several low-power LEDs have been introduced by big international factories, in which, the insulating layer is filled into an opened groove and plated with metal and an integrated LED is made after serial or parallel connection. Under serial connection, a low current passes through the small LED units and a high-voltage and low-current LED is formed. Compared with high-voltage diodes by wiring several light emitting diodes in series, the high-voltage light emitting diode has lower thermal resistance, which requires smaller heat dissipation modules in lighting fixtures.

According to Chinese patent CN03820622.6, an integrated light-emitting device is disclosed, where several LED arrays are formed in a two-dimensional single chip on an insulating substrate like sapphire, and overhead bridge wiring is made between single LEDs and between the LED and the electrode. High drive voltage and low drive current are obtained through zigzag-shaped configuration of LED arrays. Problems exist in this integrated light-emitting device, like low light emitting efficiency, difficult heat dissipation, low power and poor reliability. Each independent LED is separated from its adjacent LEDs by etching an N-type semiconductor layer to the insulating substrate surface. Serial wires have to pass through the groove with extremely large height difference, easily causing disconnection of wires during fabrication and making the entire diode impossible to be connected.

SUMMARY

To solve the aforesaid problems, the present disclosure aims at providing a high-voltage LED chip structure and the fabrication method thereof to reduce groove area, increase effective light emitting region area and output of single wafer-level chips and improve serial/parallel connection yield and light emitting efficiency.

According to the first aspect of the present disclosure, a high-voltage LED chip is provided, comprising: a substrate and a light-emitting epitaxial laminated layer on the substrate; the light-emitting epitaxial laminated layer has several light emitting units, each comprising, from bottom to up, an N-type semiconductor layer, a light emitting layer and a P-type semiconductor layer; the light emitting units are separated from each other through the extremely-narrow groove above the substrate, wherein, the groove opening width is less than or equals to 0.4 µm; an insulating material layer cured from liquid insulating materials that stretches across the opening end of the extremely-narrow groove yet is not adhered to the side wall of the groove; and electrode connection wires on the insulating material layer, which electrically connect the adjacent light emitting units through the P electrodes or/and the N electrodes of the adjacent units.

According to a second aspect of the present disclosure, a high-voltage LED chip is provided, comprising: a substrate and a light-emitting epitaxial laminated layer on the substrate; the light-emitting epitaxial laminated layer has several light emitting units, each comprising, from bottom to up, an N-type semiconductor layer, a light emitting layer and a P-type semiconductor layer; the light emitting units are separated from each other through the extremely-narrow groove above the substrate, wherein, the groove opening width is less than or equals to 0.4 µm; and electrode connection wires cured from liquid conducting materials that stretch across the opening end of the extremely-narrow groove yet are not adhered to the side wall of the groove, which electrically connect the adjacent light emitting units through the P electrodes or/and the N electrodes of the adjacent units.

According to a third aspect of the present disclosure, a fabrication method of high-voltage LED chips is provided, comprising: providing a substrate; forming a light-emitting epitaxial laminated layer on the substrate; patterning the light-emitting epitaxial laminated layer and forming an extremely-narrow groove till exposure to the substrate surface to divide the light-emitting epitaxial laminated layer into several light emitting units, thus forming a light emitting diode wafer, wherein, each light emitting unit, from bottom to up, comprises an N-type semiconductor layer, a light emitting layer and a P-type semiconductor layer, and the groove opening width is less than or equals to 0.4 µm; coating a liquid insulating material layer on the light emitting diode wafer surface; heating and curing the liquid insulating material layer; patterning the cured liquid insulating material layer to make it stretch across the opening end of the extremely-narrow groove yet is not adhered to the side wall of the groove; and forming electrode connection wires on the insulating material layer that electrically connect the adjacent light emitting units.

According to a fourth aspect of the present disclosure, a fabrication method of high-voltage LED chips is provided, comprising: providing a substrate; forming a light-emitting epitaxial laminated layer on the substrate; patterning the light-emitting epitaxial laminated layer and forming an extremely-narrow groove till exposure to the substrate surface to divide the light-emitting epitaxial laminated layer into several light emitting units, thus forming a light emitting diode wafer, wherein, the light emitting unit, from bottom to up, comprises an N-type semiconductor layer, a light emitting layer and a P-type semiconductor layer, and the groove opening width is less than or equals to 0.4 µm; coating a liquid conducting material layer on the light emitting diode wafer surface; heating and curing the liquid conducting material layer; patterning the cured liquid conducting material layer to make it as the electrode connection wire that stretches across the opening end of the extremely-narrow groove yet is not adhered to the side wall of the groove, and electrically connects adjacent light emitting units.

Preferably, the substrate is an insulating substrate, like a sapphire substrate, an AlN substrate or other non-conducting substrates.

Preferably, the light-emitting epitaxial laminated layer is formed through the metal-organic chemical vapor deposition (MOCVD).

Preferably, the light emitting unit is in parallelogram, rectangle, circular or oval.

Preferably, the liquid insulating material layer is made of spin coating glass (SOG), polymer, silica gel or any of their combinations.

Preferably, the liquid conducting material layer is made of liquid ITO, liquid metal, conductive adhesive (such as elargol), electrically conductive silicone, or any of their combinations.

Preferably, the extremely-narrow groove is formed through wet etching, dry etching, laser etching or any of their combinations.

Preferably, the cured liquid insulating material layer after patterning, except stretching across the opening end of the extremely-narrow groove yet being not adhered to the side wall of the groove, also extends to part of the side wall of the light-emitting epitaxial laminated layer of one of the adjacent light emitting units.

Preferably, the cured liquid insulating material layer after patterning, except stretching across the opening end of the extremely-narrow groove yet being not adhered to the side wall of the groove, also extends to part of the side walls of the light-emitting epitaxial laminated layers of the adjacent light emitting units.

Preferably, before coating a liquid conducting material layer on the light emitting diode wafer surface, an insulating material layer is formed, which, except stretching across the opening end of the extremely-narrow groove yet being not adhered to the side wall of the groove, also extends to part of the side wall(s) of the light-emitting epitaxial laminated layer(s) of the adjacent light emitting units (or one of the adjacent light emitting units).

Preferably, the cured liquid conducting material layer after patterning, except stretching across the opening end of the extremely-narrow groove yet being not adhered to the side wall of the groove, also extends to the insulating material layer at part of the side wall(s) of the light-emitting epitaxial laminated layer(s) of the adjacent light emitting units (or one of the adjacent light emitting units).

In another aspect, a light-emitting system is provided including a plurality of the high-voltage LED chips described above. The light-emitting system can be used, for example, lighting, signage, display, etc.

Compared with prior art, various embodiments of the present disclosure can have one or more of the following advantages: the liquid insulating material layer/the liquid conducting material layer, after curing, is used for insulating/connecting, making the isolated groove between the light emitting units extremely narrow (opening width ≤0.4 µm), which improves single chip output, expands effective light emitting region area and improves light emitting efficiency; the serial/parallel connection yield is improved for this method avoids easy disconnection of wires across a groove with extremely large height difference in conventional high-voltage light emitting diodes; in addition, the manufacturing cost is reduced for the LED can be directly fabricated at the chip fabrication end.

101, 201, 301, 401: substrate;
102, 202, 302, 402: N-type semiconductor layer;
103, 203, 303, 403: light emitting layer;
104, 204, 304, 404: P-type semiconductor layer;
105, 205, 305, 405: extremely-narrow groove;
106, 206, 306, 406: P electrode;
107, 207, 307, 407: N electrode;
108, 208, 408: insulating material layer;
109, 209, 309, 409: electrode connection wires.

DETAILED DESCRIPTION

The LED device structure and fabrication method thereof will be described in detail with reference to the schematic diagrams, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this invention.

Embodiment 1

Figure 1:
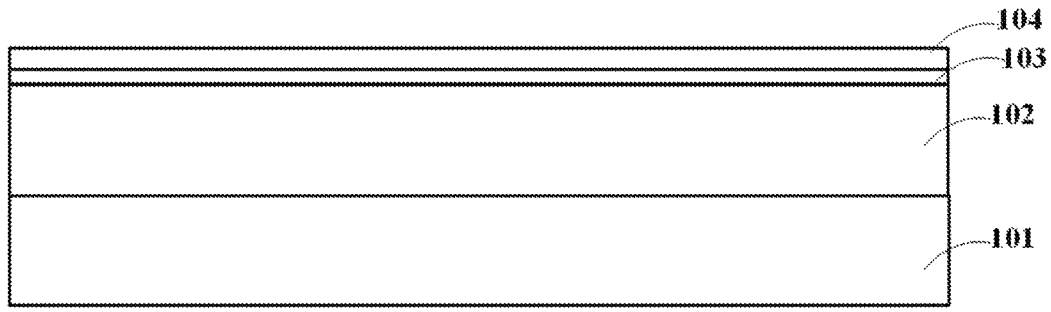
FIG. 1 is a schematic diagram for a first step of fabricating a high-voltage LED chip according to Embodiment 1.

Referring to FIGS. 1-6, the schematic diagrams for fabricating a high-voltage LED chip according to this present disclosure, the implementation steps comprise:

Referring to FIG. 1, provide a substrate 101 for epitaxial growth, preferably, a sapphire insulating substrate, or an AlN substrate or other non-conducting substrates; form a light-emitting epitaxial laminated layer on the substrate 101 through MOCVD, which comprises, from bottom to up, an N-type semiconductor layer 102, a light emitting layer 103 and a P-type semiconductor layer 104.

Figure 2:
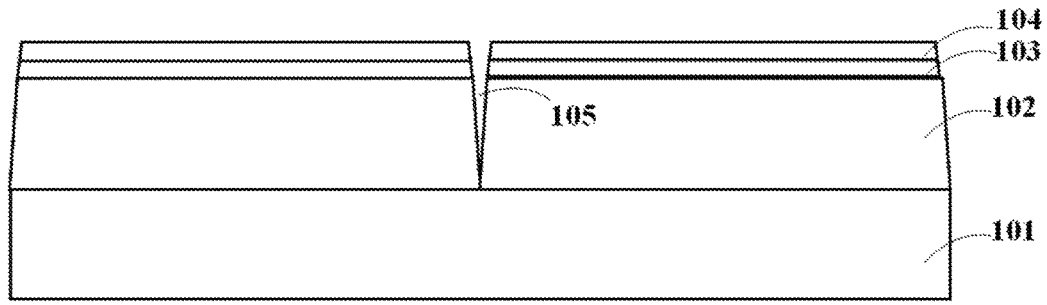
FIG. 2 is a schematic diagram for a second step of fabricating a high-voltage LED chip according to Embodiment 1.

Referring to FIG. 2, pattern the light-emitting epitaxial laminated layer and form a V-shaped extremely-narrow groove 105 till exposure to the substrate 101 surface to divide the light-emitting epitaxial laminated layer into several circular light emitting units (as shown in the figure, there are 2 light emitting units; however, number of the light emitting units can be added based on actual requirements), thus forming a light emitting diode wafer, wherein, the light emitting unit, from bottom to up, comprises an N-type semiconductor layer 102, a light emitting layer 103 and a P-type semiconductor layer 104, and opening width of the extremely-narrow groove 105 is ≤0.4 μm; and the depth of the groove depends on the thickness of the light-emitting epitaxial laminated layer, in general, from several micrometers to a dozen of micrometers, and 10 μm is preferred in this embodiment.

Figure 3:
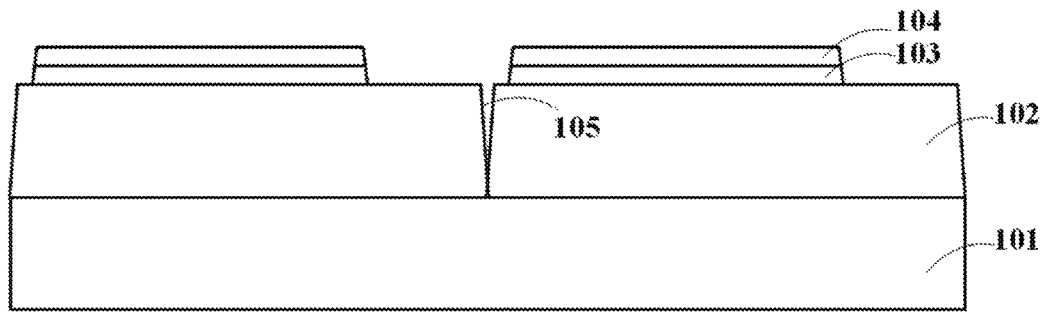
FIG. 3 is a schematic diagram for a third step of fabricating a high-voltage LED chip according to Embodiment 1.

Referring to FIG. 3, etch from the surface of the P-type semiconductor layer 104 downwards to the N-type semiconductor layer 102 through dry/wet etching to expose some parts of the N-type semiconductor layer 102; and form the side wall of the light-emitting epitaxial laminated layer into an inclined plane through laser cutting.

Figure 4:
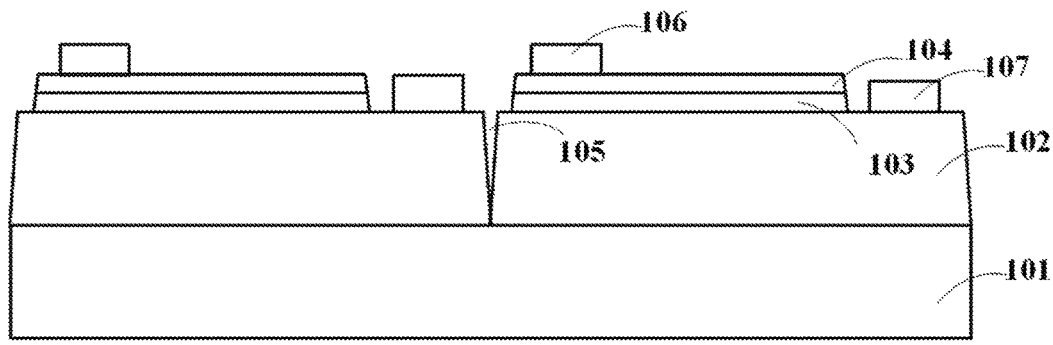
FIG. 4 is a schematic diagram for a fourth step of fabricating a high-voltage LED chip according to Embodiment 1.

Referring to FIG. 4, fabricate a P electrode 106 and an N electrode 107 on the P-type semiconductor layer 104 and the exposed N-type semiconductor layer 102.

Figure 5:
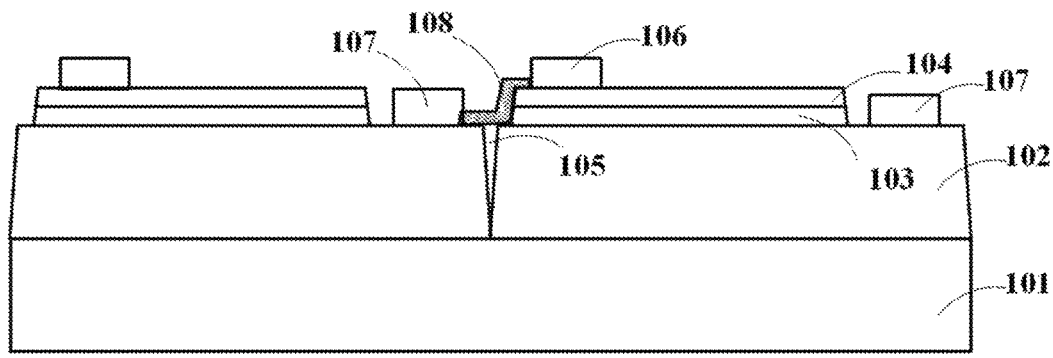
FIG. 5 is a schematic diagram for a fifth step of fabricating a high-voltage LED chip according to Embodiment 1.

Referring to FIG. 5, coat the liquid insulating material layer made of polymer on the light emitting diode wafer surface, and then heat and cure the liquid insulating material layer; pattern the cured liquid insulating material layer through its surface tension via photomask and etching/stripping, to enable that the insulating material layer 108 stretches across the opening end of the extremely-narrow groove 105 yet is not adhered to the side wall of the groove, and also extends to part of the side wall of the light-emitting epitaxial laminated layer of a single light emitting unit.

Figure 6:
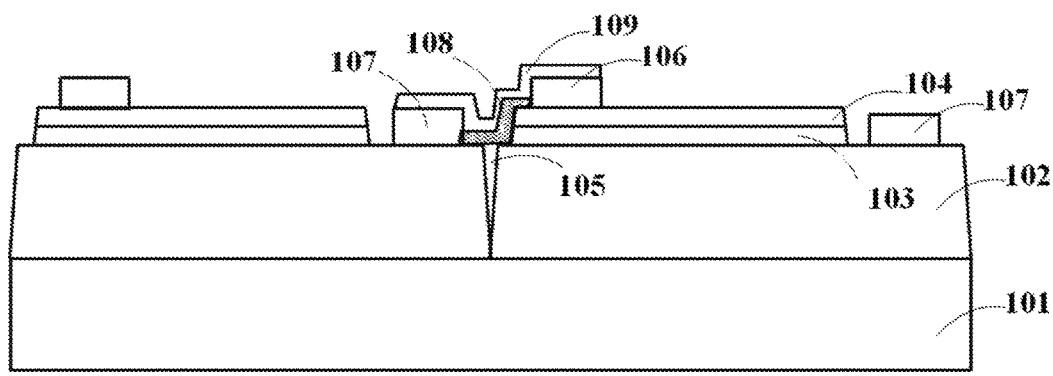
FIG. 6 is a schematic diagram for a sixth step of fabricating a high-voltage LED chip according to Embodiment 1.

Referring to FIG. 6, form electrode connection wires 109 on the insulating material layer 108 through electronic beam evaporation, which connect the adjacent light emitting units through the P electrode 106 and the N electrode 107 by serial connection.

Referring to FIG. 6 for the high-voltage LED chip structure fabricated through the aforesaid steps. The high-voltage LED structure comprises: a substrate 101 and a light-emitting epitaxial laminated layer on the substrate; the light-emitting epitaxial laminated layer has several circular light emitting units, each comprising, from bottom to up, an N-type semiconductor layer 102, a light emitting layer 103 and a P-type semiconductor layer 104; the light emitting units are separated from each other through the extremely-narrow groove 105 above the substrate, wherein, the groove 105 opening width is less than or equals to 0.4 μm; a P electrode 106 and an N electrode 107 formed on the P-type semiconductor layer 104 and the exposed N-type semiconductor layer 102 respectively; a polymer insulating material layer 108 that stretches across the opening end of the extremely-narrow groove yet is not adhered to the side wall of the groove, and also extends to the part of the side wall of the light-emitting epitaxial laminated layer of one of the adjacent light emitting units; electrode connection wires 109 on the insulating material layer 108, which connect the adjacent light emitting units through the P electrode 106 and the N electrode 107 of the adjacent units by serial connection.

In various embodiments of the present disclosure, the liquid insulating material layer/the liquid conducting material layer, after curing, is used for insulating/connecting, making the isolated groove between the light emitting units extremely narrow. In addition, the insulating material layer stretches across the opening end of the extremely-narrow groove yet is not adhered to the side wall of the groove, i.e., is not filled into the groove with high depth difference, making the electrode connection wires formed in later processes relatively flat, without causing big ups, downs or sags. In this way, connection yield and device reliability are improved.

Embodiment 2

Figure 7:
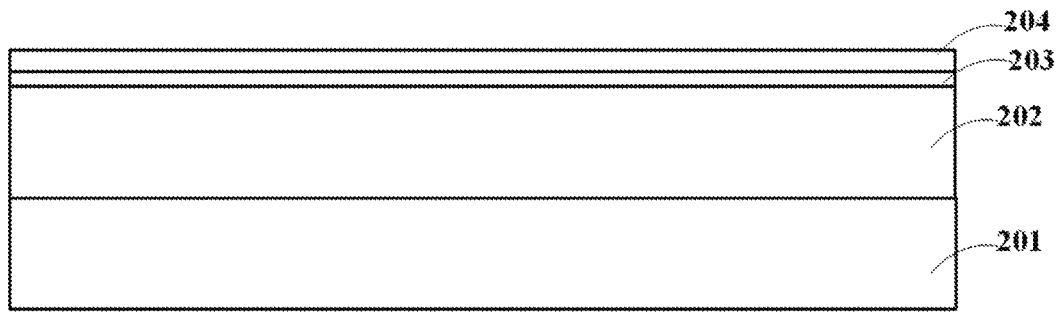
FIG. 7 is a schematic diagram for a first step of fabricating a high-voltage LED chip according to Embodiment 2.

Referring to FIGS. 7-12, the schematic diagrams for fabricating a high-voltage LED chip according to this present disclosure, the implementation steps comprise:

Referring to FIG. 7, provide a substrate 201 for epitaxial growth, preferably, a sapphire insulating substrate; form a light-emitting epitaxial laminated layer on the substrate 201 through MOCVD, which comprises, from bottom to up, an N-type semiconductor layer 202, a light emitting layer 203 and a P-type semiconductor layer 204.

Figure 8:
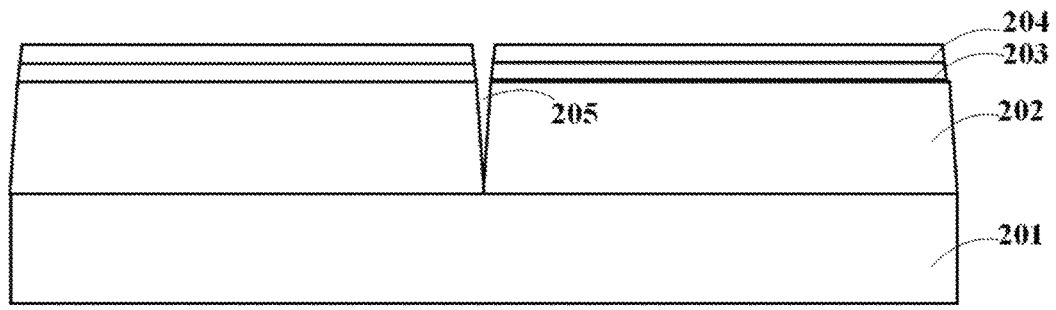
FIG. 8 is a schematic diagram for a second step of fabricating a high-voltage LED chip according to Embodiment 2.

Referring to FIG. 8, pattern the light-emitting epitaxial laminated layer and form a V-shaped extremely-narrow groove 205 till exposure to the substrate 201 surface to divide the light-emitting epitaxial laminated layer into several rectangular light emitting units, thus forming a light emitting diode wafer, wherein, the light emitting unit, from bottom to up, comprises an N-type semiconductor layer 202, a light emitting layer 203 and a P-type semiconductor layer 204, and opening width of the extremely-narrow groove 205 is ≤0.4 μm.

Figure 9:
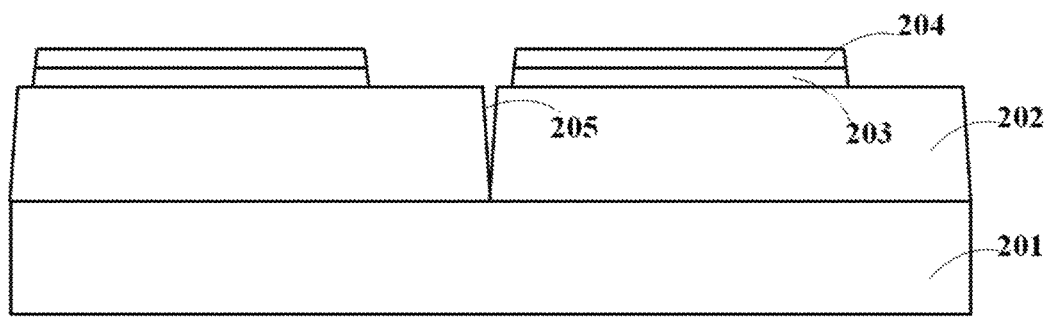
FIG. 9 is a schematic diagram for a third step of fabricating a high-voltage LED chip according to Embodiment 2.

Referring to FIG. 9, etch from the surface of the P-type semiconductor layer 204 downwards to the N-type semiconductor layer 202 through dry/wet etching to expose some parts of the N-type semiconductor layer 202; and form the side wall of the light-emitting epitaxial laminated layer into an inclined plane through drilling tool cutting.

Figure 10:
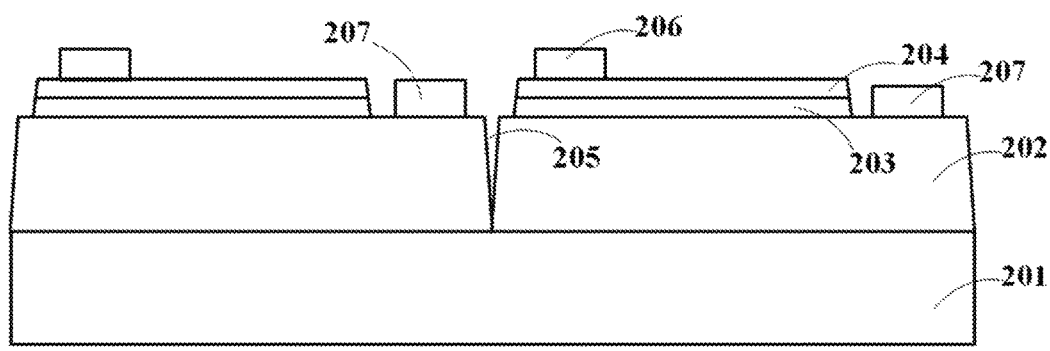
FIG. 10 is a schematic diagram for a fourth step of fabricating a high-voltage LED chip according to Embodiment 2.

Referring to FIG. 10, fabricate a P electrode 206 and an N electrode 207 on the P-type semiconductor layer 204 and the exposed N-type semiconductor layer 202.

Figure 11:
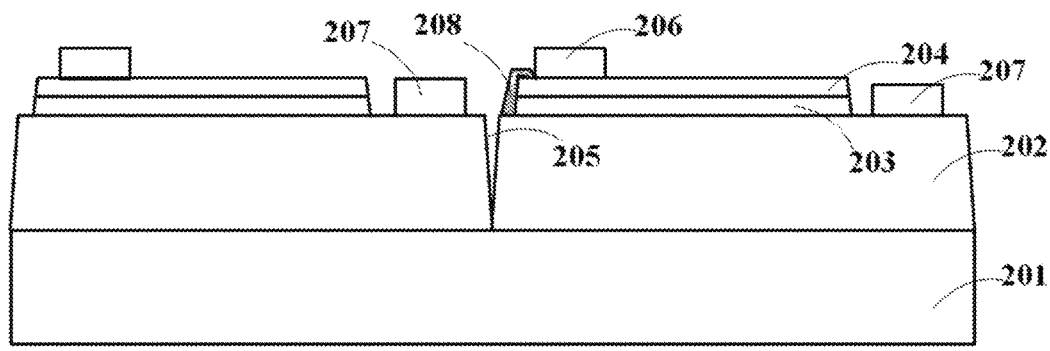
FIG. 11 is a schematic diagram for a fifth step of fabricating a high-voltage LED chip according to Embodiment 2.

Referring to FIG. 11, coat the liquid insulating material layer made of silica gel on the light emitting diode wafer surface, and then heat and cure the liquid insulating material layer; pattern the cured liquid insulating material layer through its surface tension via photomask and etching/stripping, to enable that the insulating material layer 208 does not stretch across the opening end of the extremely-narrow groove 205 and only extends to part of the side wall of the light-emitting epitaxial laminated layer.

Figure 12:
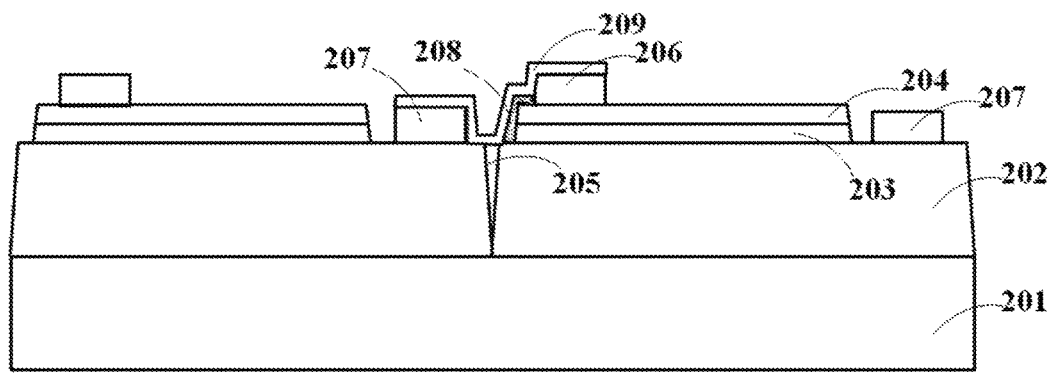
FIG. 12 is a schematic diagram for a sixth step of fabricating a high-voltage LED chip according to Embodiment 2.

Referring to FIG. 12, coat an ITO liquid conducting material layer on the light emitting diode wafer surface, and then heat and cure the liquid conducting material layer; pattern the cured liquid conducting material layer through capillarity of the ITO liquid conducting materials via photomask and etching/stripping, to enable the cured conducting material layer as the electrode connection wires 209, which stretch across the opening end of the extremely-narrow groove yet are not adhered to the side wall of the groove, and also extend to the insulating material layer at the side wall of part of the light-emitting epitaxial laminated layer of one of the adjacent light emitting units, and in this way, the adjacent light emitting units are connected in serial connection through the P electrode 206 and the N electrode 207.

Refer to FIG. 12 for the high-voltage LED chip structure fabricated through the aforesaid steps. The high-voltage LED structure comprises: a substrate 201 and a light-emitting epitaxial laminated layer on the substrate; the light-emitting epitaxial laminated layer has several circular light emitting units, each comprising, from bottom to up, an N-type semiconductor layer 202, a light emitting layer 203 and a P-type semiconductor layer 204; the light emitting units are separated from each other through the extremely-narrow groove 205 above the substrate, wherein, the groove 205 opening width is less than or equals to 0.4 μm; a P electrode 206 and an N electrode 207 formed on the P-type semiconductor layer 204 and the exposed N-type semiconductor layer 202 respectively; an insulating material layer 208 that does not stretch across the opening end of the extremely-narrow groove 205 and only extends to part of the side wall of the light-emitting epitaxial laminated layer; electrode connection wires 209 cured from the ITO liquid conducting material layer, which stretch across the opening end of the extremely-narrow groove yet are not adhered to the side wall of the groove, and also extend to the insulating material layer at part of the side wall of the light-emitting epitaxial laminated layer of one of the adjacent light emitting units, and in this way, the adjacent light emitting units are connected in serial connection through the P electrode 206 and the N electrode 207.

Embodiment 3

Figure 13:
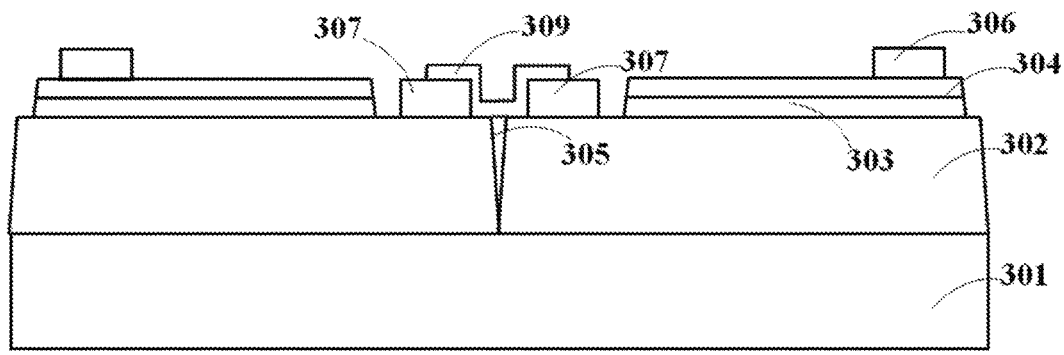
FIG. 13 is a structural schematic diagram of a high-voltage LED chip according to Embodiment 3.

Referring to FIG. 13, compared with Embodiment 2, in this embodiment, the electrode connection wires 309 stretch across the opening end of the extremely-narrow groove yet are not adhered to the side wall of the groove, and do not extend to part of the side walls of the light-emitting epitaxial laminated layers of the adjacent light emitting units, and the electrode connection wires 309 connect the adjacent light emitting units in serial connection through the N electrode 307 of the adjacent light emitting units. The cured liquid conducting material layer directly stretches across the opening end of the extremely-narrow groove yet is not adhered to the side wall of the groove, and in this way, the conventional insulating material layer between the side wall of the light-emitting epitaxial laminated layer and the electrode connection wires is omitted, thus simplifying manufacturing processes and saving costs.

Embodiment 4

Figure 14:
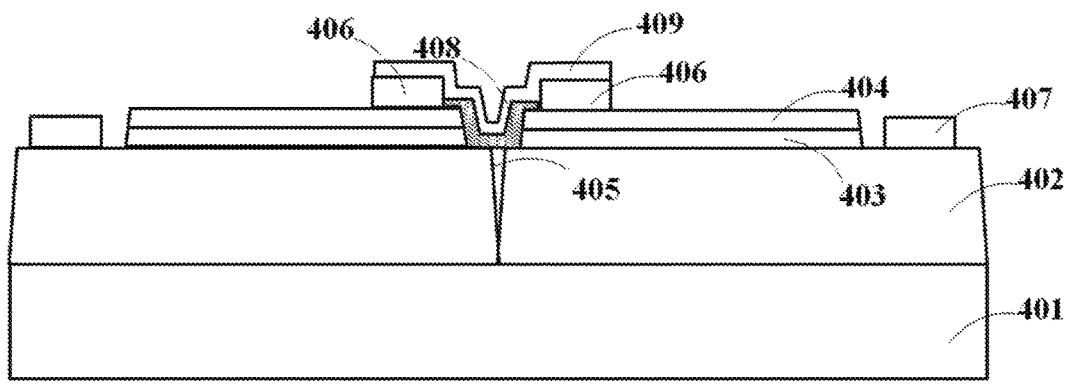
FIG. 14 is a structural schematic diagram of a high-voltage LED chip according to Embodiment 4.

Referring to FIG. 14, compared with Embodiment 1, the insulating material layer 408 in this embodiment is made of spin coating glass (SOG), which, except stretching across the opening end of the extremely-narrow groove yet being not adhered to the side wall of the groove, also extends to part of the side walls of the light-emitting epitaxial laminated layers of the adjacent light emitting units; in this embodiment, the electrode connection wires 409 are made of elargol, which, except stretching across the opening end of the extremely-narrow groove yet being not adhered to the side wall of the groove, also extend to the insulating material layer of part of the side walls of the light-emitting epitaxial laminated layers of the adjacent light emitting units.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A high-voltage LED chip, comprising:
   a substrate; and
   a light-emitting epitaxial laminated layer over the substrate;
   wherein:
      the light-emitting epitaxial laminated layer comprises:
         a plurality of light emitting units each including, from bottom to up, an N-type semiconductor layer, a light emitting layer, and a P-type semiconductor layer; and
      the plurality of light emitting units are separated from each other through grooves over the substrate; and
      a solid material layer cured from a liquid material stretches across an opening of one of the grooves facilitated by surface tension of the liquid material without adhering to side walls of the groove;
      wherein the opening has a width less than or equal to 0.4 μm such that the surface tension is sufficient for the liquid material to stretch across the opening to form a substantially flat bridge and no solid material is filled into the grooves; and
      wherein the groove is in the N-type semiconductor layer, exposes an upper surface of the substrate, and has the opening flush with an upper surface of the N-type semiconductor layer.

2. The high-voltage LED chip of claim 1, wherein the liquid material is a liquid insulating material or a liquid conductive material.

3. The high-voltage LED chip of claim 1, wherein the liquid material is a liquid insulating material, the LED chip further comprising electrode connection wires disposed over the solid material layer and electrically connecting adjacent light emitting units through P electrodes or/and N electrodes of the adjacent light emitting units.

4. The high-voltage LED chip of claim 3, wherein the liquid insulating material comprises at least one of spin-on glass (SOG), polymer, or silica gel.

5. The high-voltage LED chip of claim 1, wherein the liquid material is a liquid conductive material electrically connecting adjacent light emitting units through P electrodes or/and N electrodes of the adjacent light emitting units.

6. The high-voltage LED chip of claim 5, wherein: the liquid conductive material comprises at least one of liquid ITO, liquid metal, liquid adhesive, or electrically conductive silicone.

7. The high-voltage LED chip of claim 1, the groove is formed with at least one of: wet etching, dry etching, or laser etching.

8. A fabrication method of a high-voltage LED chip, the method comprising:
   forming a light-emitting epitaxial laminated layer over a substrate;
   patterning the light-emitting epitaxial laminated layer and forming a groove to expose a surface of the substrate to thereby divide the light-emitting epitaxial laminated layer into a plurality of rectangular light emitting units, thereby forming a light emitting diode wafer, wherein each light emitting unit comprises, from bottom up, an N-type semiconductor layer, a light emitting layer, and a P-type semiconductor layer;

coating a liquid material layer over a surface of the light emitting diode wafer and forming a bridge across an opening of the groove facilitated by surface tension of the liquid material; and heating and curing the liquid material layer to form a solid material layer that does not adhered to side walls of the groove;

wherein the resulting high-voltage LED chip comprises:

the substrate; and the light-emitting epitaxial laminated layer over the substrate;

wherein:

the light-emitting epitaxial laminated layer comprises the plurality of light emitting units each including, from bottom to up, the N-type semiconductor layer, the light emitting layer, and the P-type semiconductor layer; and the plurality of light emitting units are separated from each other through a plurality of grooves over the substrate;

the solid material layer cured from the liquid material stretches across the opening of the groove facilitated by surface tension of the liquid material without adhering to the side walls of the groove;

wherein the opening has a width less than or equal to 0.4 μm such that the surface tension is sufficient for the liquid material to stretch across the opening to form a substantially flat bridge and no solid material is filled into the grooves; and wherein the groove is in the N-type semiconductor layer, exposes an upper surface of the substrate, and has the opening flush with an upper surface of the N-type semiconductor layer.

9. The fabrication method of claim 8, wherein the liquid material is a liquid insulating material, and the solid material layer is an insulating material layer, the method further comprising forming electrode connection wires over the insulating material layer to electrically connect the adjacent light emitting units.

10. The fabrication method of claim 9, wherein the cured liquid insulating material layer after patterning, in addition to stretching across the opening of the groove without adhering to the side walls of the groove, also extends to a side wall of the light-emitting epitaxial laminated layer of one of the adjacent light emitting units.

11. The fabrication method of claim 9, wherein the cured liquid insulating material layer, after said patterning, bridges across the opening of the groove without adhering to side walls of the groove, and also extends to a portion of side walls of the light-emitting epitaxial laminated layers of the adjacent light emitting units.

12. The fabrication method of claim 8, wherein the liquid material is a liquid conductive material, the method further comprising patterning the cured liquid conductive material layer as electrode connection wires across the opening of the groove and electrically connecting the adjacent light emitting units.

13. The fabrication method of claim 12, further comprising: prior to coating the liquid conductive material layer over the light emitting diode wafer surface, an insulating material layer is formed and bridges across the opening of the groove without adhered to the side wall of the groove, and extends to a portion of a side wall of the light-emitting epitaxial laminated layer of one of the adjacent light emitting units.

14. The fabrication method of claim 13, wherein the cured liquid conductive material layer, after said patterning, bridges across the opening end of the groove without adhering to the side wall of the groove, and extends to a portion of the side wall of the light-emitting epitaxial laminated layer of the one of the adjacent light emitting units.

15. A light-emitting system comprising a plurality of high-voltage LED chips, each LED chip comprising:

a substrate; and a light-emitting epitaxial laminated layer over the substrate;

wherein:

the light-emitting epitaxial laminated layer comprises a plurality of light emitting units each including, from bottom to up, an N-type semiconductor layer, a light emitting layer, and a P-type semiconductor layer; and the plurality of light emitting units are separated from each other through grooves over the substrate;

a solid material layer cured from a liquid material stretches across an opening of one of the grooves facilitated by surface tension of the liquid material without adhering to side walls of the groove; and wherein the opening has a width less than or equal to 0.4 μm such that the surface tension is sufficient for the liquid material to stretch across the opening to form a substantially flat bridge and no solid material is filled into the grooves; and wherein the groove is in the N-type semiconductor layer, exposes an upper surface of the substrate, and has the opening flush with an upper surface of the N-type semiconductor layer.

16. The light-emitting system of claim 15, wherein the liquid material is a liquid conductive material, and the solid material layer is a cured solid conductive material layer.

17. The light-emitting system of claim 15, wherein the groove has an opening with a width less than or equal to 0.4 μm, and wherein the liquid material is a liquid insulating material, and the solid material layer is a cured solid insulating material layer.

* * * * *